United States Patent
Cheon

(10) Patent No.: US 12,439,686 B2
(45) Date of Patent: Oct. 7, 2025

(54) CRYSTALLINE P-TYPE SEMICONDUCTOR FILM AND THIN FILM TRANSISTOR AND DIODE AND ELECTRONIC DEVICE

(71) Applicant: ADRC. CO. KR, Seoul (KR)

(72) Inventor: Jun Hyuk Cheon, Seoul (KR)

(73) Assignee: ADRC. CO. KR, Seoul (KR)

( * ) Notice: Subject to any disclaimer, the term of this patent is extended or adjusted under 35 U.S.C. 154(b) by 411 days.

(21) Appl. No.: 17/965,014

(22) Filed: Oct. 13, 2022

(65) Prior Publication Data

US 2023/0207579 A1    Jun. 29, 2023

(30) Foreign Application Priority Data

Dec. 27, 2021    (KR) .......................... 10-2021-0188967

(51) Int. Cl.
| | | |
|---|---|---|
| H10D 86/01 | (2025.01) | |
| H10D 30/67 | (2025.01) | |
| H10D 86/40 | (2025.01) | |
| H10D 86/60 | (2025.01) | |

(52) U.S. Cl.
CPC ..... *H10D 86/0227* (2025.01); *H10D 30/6731* (2025.01); *H10D 30/6739* (2025.01); *H10D 30/6745* (2025.01); *H10D 30/6755* (2025.01); *H10D 86/421* (2025.01); *H10D 86/60* (2025.01)

(58) Field of Classification Search
CPC .......... H10D 86/0227; H10D 30/6731; H10D 30/6739; H10D 86/421; H10D 62/40
See application file for complete search history.

(56) References Cited

U.S. PATENT DOCUMENTS

2018/0151835 A1*    5/2018    Kim .................. H10K 59/8731

FOREIGN PATENT DOCUMENTS

| CN | 112038216 | 12/2020 | |
|---|---|---|---|
| KR | 10-2009-0083637 | 8/2009 | |
| KR | 10-2020-0029674 | 3/2020 | |
| KR | 20200029674 A * | 3/2020 | ........... H10D 30/031 |

OTHER PUBLICATIONS

Machine translation of Noh (KR 20200029674 A) (Year: 2020).*
Mude, Narendra Naik, Ravindra Naik Bukke, and Jin Jang. "Transparent, P-channel CuISn Thin-film Transistor with Field Effect Mobility of 45 cm2 V-1 s-1 and Excellent Bias Stability." Advanced Materials Technologies 7.8 (2022): 2101434. (Year: 2022).*
Taehwan Jun et al., "Material Design of p-Type Transparent Amorphous Semiconductor, Cu—Sn—I", Advanced Materials, 2018, 1706573, Jan. 30, 2018, DOI: 10.1002/adma.201706573.
Aili McConnon, "Researchers create highly transparent p-type copper iodide with enhanced electrical performance", AIP Publishing, Sep. 22, 2020, https://doi.org/10.1063/10.0002052.
Siyuan Li et al., "Solution-Processed Transparent Sn4+-Doped CuI Hybrid Photodetectors with Enhanced Performances", Advanced Materials, Interfaces 2019, vol. 6, 1900669, 1-11.

* cited by examiner

*Primary Examiner* — Jacob Y Choi
*Assistant Examiner* — Aaron Michael Wegner
(74) *Attorney, Agent, or Firm* — LEX IP MEISTER, PLLC

(57) ABSTRACT

Disclosed are a crystalline p-type semiconductor film having a plurality of crystal grains with an average grain size of submicron and including a tin-doped copper halide, and a semiconductor device, a thin film transistor, a diode, and an electronic device including the same.

14 Claims, 12 Drawing Sheets

CRYSTALLINE P-TYPE SEMICONDUCTOR FILM AND THIN FILM TRANSISTOR AND DIODE AND ELECTRONIC DEVICE

CROSS-REFERENCE TO RELATED APPLICATION

This application claims priority to and the benefit of Korean Patent Application No. 10-2021-01 88967 filed in the Korean Intellectual Property Office on Dec. 27, 2021, the entire contents of which are incorporated herein by reference.

BACKGROUND OF THE INVENTION

(a) Field of the Invention

A crystalline p-type semiconductor film, a thin film transistor, a diode, and an electronic device are disclosed.

(b) Description of the Related Art

A display panel such as a liquid crystal display panel or an organic light emitting display panel includes a thin film transistor (TFT), which is a three-terminal element, as a switching element and/or a driving element. On the other hand, the light emitting device or sensor includes a diode that is a two-terminal element. One of the factors that determine the performance of devices such as thin film transistor or diode is semiconductor.

SUMMARY OF THE INVENTION

In recent years, oxide semiconductors have been studied as semiconductors that may be applied to thin film transistor or diode. However, among oxide semiconductors, n-type oxide semiconductors show favorable results with respect to various physical properties such as charge mobility, optical transparency, and processability, whereas p-type oxide semiconductors have limitations in exhibiting improved electrical properties due to low charge mobility. Therefore, there is a need for research on new p-type semiconductors that satisfy physical properties such as charge mobility, optical transparency, and processability.

An embodiment provides a crystalline p-type semiconductor film that satisfies high charge mobility, optical transparency, and processability.

Another embodiment provides a thin film transistor including the crystalline p-type semiconductor film.

Another embodiment provides a diode including the crystalline p-type semiconductor film.

Another embodiment provides an electronic device including the crystalline p-type semiconductor film, the thin film transistor, or the diode.

According to an embodiment, a crystalline p-type semiconductor film has a plurality of crystal grains having an average grain size of submicron and includes a tin-doped copper halide.

The tin-doped copper halide may be tin-doped copper(I) iodide.

A ratio of tin to a total content of the tin-doped copper halide may be greater than or equal to about 10 wt % and less than about 50 wt %.

The ratio of tin to the total content of the tin-doped copper halide may be about 20 wt % to about 30 wt %.

A size of the plurality of crystal grains may be distributed within the range of more than about 0 nm and less than or equal to about 200 nm.

An XRD spectrum of the crystalline p-type semiconductor film may have diffraction peaks corresponding to at least one of (200), (220), and (311) planes.

An energy bandgap of the crystalline p-type semiconductor film may be about 2.5 eV to about 3.2 eV.

Transmittance of the crystalline p-type semiconductor film at a wavelength of about 550 nm may be about 75% to about 100%.

According to another embodiment, a semiconductor device including the crystalline p-type semiconductor film is provided.

According to another embodiment, a thin film transistor includes a gate electrode, a semiconductor layer overlapped with the gate electrode, and a source electrode and a drain electrode electrically connected to the semiconductor layer, wherein the semiconductor layer includes the crystalline p-type semiconductor film.

The thin film transistor may further include a passivation layer on the semiconductor layer, and the passivation layer may include poly(methyl methacrylate).

According to another embodiment, a diode includes an anode and a cathode, and an active layer between the anode and the cathode, wherein the active layer includes the crystalline p-type semiconductor film.

The active layer may further include an n-type semiconductor, and the n-type semiconductor may include an n-type metal oxide semiconductor.

The n-type metal oxide semiconductor may include lithium-doped zinc oxide, zinc oxide nanoparticles, or a combination thereof.

The active layer may include a p-type semiconductor layer including the crystalline p-type semiconductor film and an n-type semiconductor layer including the n-type semiconductor.

According to another embodiment, an electronic device includes the crystalline p-type semiconductor film, the semiconductor device, the thin film transistor, or the diode.

The crystalline p-type semiconductor film may satisfy high charge mobility, optical transparency, and processability, and thereby a high-performance p-channel thin film transistor and diode may be realized.

DETAILED DESCRIPTION OF THE EMBODIMENTS

Figure 1:
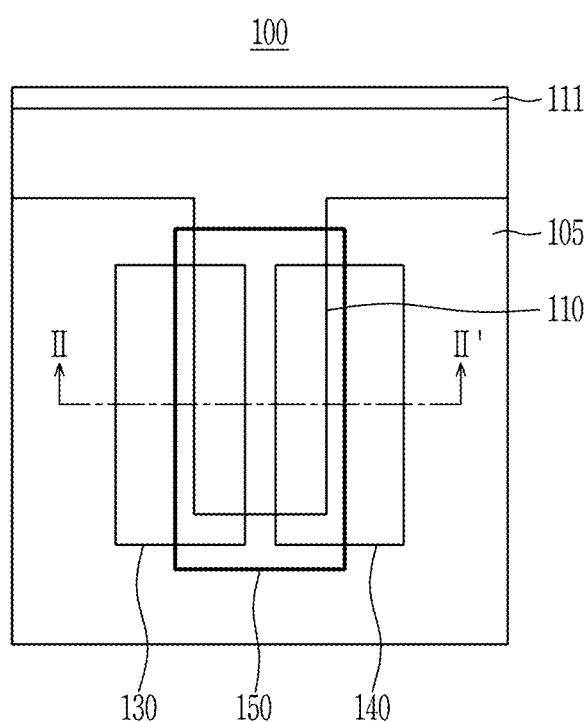
FIG. 1 is a plan view showing an example of a thin film transistor according to an embodiment.

Hereinafter, embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

Hereinafter, the terms "lower" and "upper" are used for better understanding and ease of description, but do not limit the position relationship.

Hereinafter, "combination" includes a mixture or stacked structure of two or more.

Hereinafter, a work function (WF), a HOMO energy level, and a LUMO energy level are expressed as an absolute value from a vacuum level. In addition, when the work function, the HOMO energy level, or the LUMO energy level is referred to be deep, high, or large, the HOMO energy level, or the LUMO energy level has a large absolute value based on "0 eV" of the vacuum level, while when the work function, the HOMO energy level, or the LUMO energy level is referred to be shallow, low, or small, the HOMO energy level, or the LUMO energy level has a small absolute value based on "0 eV" of the vacuum level.

Hereinafter, an energy bandgap refers to an absolute value of a difference between the HOMO energy level and LUMO energy level, and the wide energy bandgap means that an absolute value of the difference between the HOMO energy level and LUMO energy level is large.

Hereinafter, a crystalline p-type semiconductor film according to an embodiment is described.

The crystalline p-type semiconductor film according to an embodiment may be a polycrystalline layer including a p-type semiconductor with a predetermined thickness, and including a tin (Sn)-doped copper halide (Sn-doped copper halide or Sn-alloyed copper halide) as the p-type semiconductor.

The tin-doped copper halide may be tin-doped copper iodide (Sn-alloyed copper(I) iodide, Sn-alloyed CuI), tin-doped copper bromide (Sn-alloyed copper(I) bromide, Sn-alloyed CuBr), tin-doped copper chloride (Sn-alloyed copper(I) chloride, Sn-alloyed CuCl), or a combination thereof, and may include, for example, tin-doped copper iodide (Sn-alloyed CuI). The tin-doped copper iodide may not only have a stable oxidation state of $Cu^+$ in tin-doped copper iodide due to the relatively large ionic radius difference between $Cu^+$ and $I^-$, but may also have a relatively large energy bandgap and high transparency.

The p-type semiconductor may have a structure in which tin is doped in a three-dimensional crystal structure of a copper halide. For example, tin may fill Cu vacancies in the crystal structure generated due to intrinsic properties of copper atoms. At this time, copper and tin have two stable oxidation states (+1 and +2) and (+2 and +4) and have similar ionic radii (91 pm and 87 pm) and (118 pm and 83 pm), so tin may effectively fill the copper vacancies.

This tin-doped copper halide may fill and reduce the copper vacancies in the crystal structure generated due to the intrinsic properties of copper atoms, and thereby may have a different energy level from that of a non-tin doped copper halide (hereinafter, referred to as 'copper halide'). For example, a Fermi level of the tin-doped copper halide may be shifted upward (a closer direction to a conduction band), compared with that of the copper halide, and accordingly, a work function (a difference between Fermi level and vacuum level) of the tin-doped copper halide may be reduced (based on an absolute value), compared with that of the copper halide. Accordingly, the tin-doped copper halide may have higher hole mobility than the copper halide.

For example, as described above, since copper and tin have a similar ionic radius, the tin filled in the copper vacancies may not substantially modify the crystal structure of the copper halide. Accordingly, the crystal structure of the tin-doped copper halide may be substantially the same as that of the copper halide, and may have a zinc blende crystal structure (zinc blende lattice) at room temperature.

A ratio ($[Sn]/([Sn]+[CuI])$) of tin in the tin-doped copper halide may be less than about 50 wt % based on the total content of the tin (Sn)-doped copper halide. The ratio of the tin may be greater than or equal to about 10 wt % and less than about 50 wt %, and within the above range, about 10 wt % to about 45 wt %, about 10 wt % to about 40 wt %, about 10 wt % to about 35 wt %, about 10 wt % to about 30 wt %, about 20 wt % to about 45 wt %, about 20 wt % to about 40 wt %, about 20 wt % to about 35 wt %, about 20 wt % to about 30 wt %, about 22 wt % to about 28 wt %, or about 25 wt %. Since tin is included in the above range in the tin-doped copper halide, while securing a sufficient charge concentration, high hole mobility may be provided.

The p-type semiconductor including the tin-doped copper halide may be formed as a polycrystalline p-type semiconductor film including a plurality of crystal grains.

The plurality of crystal grains of the p-type semiconductor film including the tin-doped copper halide may have a relatively small size, and for example, the plurality of grains may have an average grain size of submicron. For example, the average grain size of the plurality of crystal grains may be less than about 1 μm, and within the above range, less than or equal to about 800 nm, less than or equal to about 500 nm, less than or equal to about 400 nm, less than or equal to about 300 nm, less than or equal to about 200 nm or less, or about 100 nm or less, and within the above range, about 10 nm to about 800 nm, about 10 nm to about 500 nm, about 10 nm to about 400 nm, about 10 nm to about 300 nm, about 10 nm to about 200 nm, about 10 nm to about 100 nm, about 30 nm to about 800 nm, about 30 nm to about 500 nm, about 30 nm to about 400 nm, about 30 nm to about 300 nm, about 30 nm to about 200 nm, or about 30 nm to about 100 nm.

The plurality of crystal grains of the p-type semiconductor film including the tin-doped copper halide may have a relatively uniform size distribution, and for example, the size of the plurality of crystal grains may be mainly distributed between greater than about 0 nm and less than or equal to about 500 nm, and within the above range, greater than about 0 nm and less than or equal to about 400 nm, greater than about 0 nm and less than or equal to about 300 nm, greater than about 0 nm and less than or equal to about 200 nm, or greater than about 0 nm and less than or equal to about 100 nm, about 10 nm to about 400 nm, about 10 nm to about 300 nm, about 10 nm to about 200 nm, about 10 nm to about 100 nm, about 20 nm to about 500 nm, about 20 nm to about 400 nm, about 20 nm to about 300 nm, about 20 nm to about 200 nm, or about 20 nm to about 100 nm. Here, the "mainly distributed" means that about 80% to about 100%, about 85% to about 100%, about 90% to about 100%, about 95% to about 100%, about 97% to about 100%, about 98% to about 100%, or about 99% to about 100% based on the total number of grains fall within the above ranges.

The p-type semiconductor film including this tin-doped copper halide may have a smaller average grain size and a narrower grain size distribution than a p-type semiconductor film including the copper halide.

The p-type semiconductor film including the tin-doped copper halide may have smaller grains and a uniform grains size, compared with the p-type semiconductor film including the copper halide, and accordingly, the grains may be arranged with high compactness in the film and have relatively thin grain boundaries between the grains. Accordingly, the p-type semiconductor film including the tin-doped copper halide may sufficiently secure a conductive region, which effectively improves hole mobility in the p-type semiconductor film.

The p-type semiconductor film including the tin-doped copper halide may be examined with respect to crystallinity by X-ray diffraction (XRD), of which an XRD spectrum shows a unique diffraction peak unlike the copper halide.

For example, the XRD spectrum of the p-type semiconductor film including the tin-doped copper halide may have a diffraction peak corresponding to the (111) plane and a diffraction peak corresponding to at least one of the (200), (220), and (311) planes. Herein, the diffraction peak corresponding to the (111) plane corresponds to the copper halide (e.g., copper iodide), and the diffraction peak corresponding to at least one of the (200), (220), and (311) planes may be a unique diffraction peak corresponding to the doped tin. For example, the XRD spectrum of the p-type semiconductor including the tin-doped copper halide may have all the diffraction peaks corresponding to the (200), (220), and (311) planes. Herein, the diffraction peak corresponding to the (111) plane may appear at a specific point (e.g., about 25.61°) where 2θ is between 25° and 26°, and the diffraction peaks corresponding to the (200), (220), and (311) planes may appear at a specific point (e.g., about 29.55°) between 29° and 30°, at a specific point (e.g., about 42.34°) between 42° and 43° and at a specific point (e.g., about 50.07°) between 50° and 51°. For example, the diffraction peak corresponding to the (111) plane may be a main peak, and the diffraction peaks corresponding to the (200), (220), and (311) planes may be determined according to the doping amount of tin.

The p-type semiconductor film including the tin-doped copper halide may have a relatively wide energy bandgap, for example, an energy bandgap of about 2.5 eV to about 3.2 eV and within the range, about 2.6 eV to about 3.1 eV or about 2.7 eV to about 3.0 eV.

The p-type semiconductor film including the tin-doped copper halide may be a transparent semiconductor film, for example, transmittance of about 75% to about 100% at a wavelength of about 550 nm and within the range, about 80% to about 100%, about 85% to about 100%, or about 90% to about 100%.

As described above, the p-type semiconductor film including the tin-doped copper halide may effectively improve hole mobility due to a change in energy levels due to effective doping of tin and reduction of copper vacancies and morphology improvement due to relatively small grains and a uniform grain size distribution. In addition, the aforementioned p-type semiconductor film may be effectively applied as a transparent semiconductor due to relatively wide energy bandgap and light transmittance.

Accordingly, the aforementioned p-type semiconductor film may be effectively applied to a semiconductor device required of high hole mobility and transparency. The semiconductor device may include, for example, a CMOS device.

For example, the aforementioned p-type semiconductor film may be applied as a semiconductor layer of a thin film transistor (TFT), for example, a transparent p-channel thin film transistor (transparent p-channel TFT).

Figure 2:
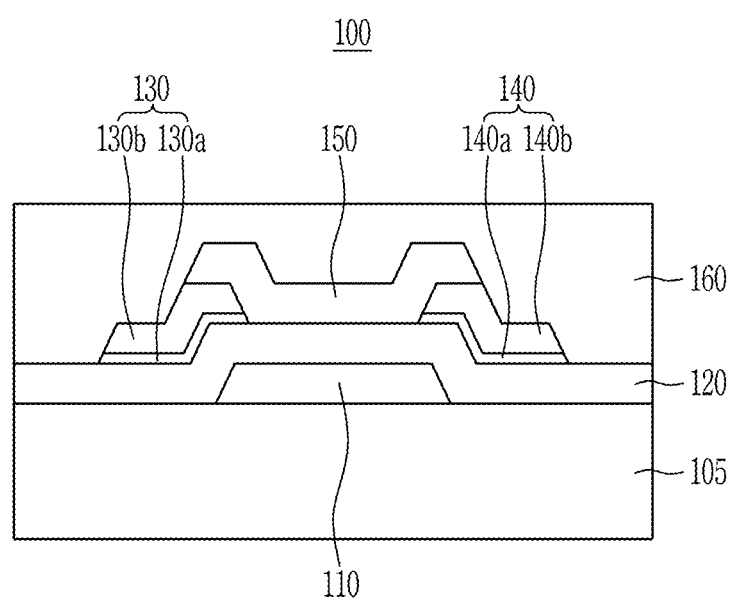
FIG. 2 is a cross-sectional view taken along the line II-II' of FIG. 1.

FIG. 1 is a plan view showing an example of a thin film transistor according to an embodiment, and FIG. 2 is a cross-sectional view taken along the line II-II' of FIG. 1.

Referring to FIGS. 1 and 2, the thin film transistor 100 according to an embodiment includes a gate electrode 110, a gate insulating layer 120, a source electrode 130 and a drain electrode 140, a semiconductor layer 150, and a passivation layer 160.

The substrate 105 may be a supporting substrate that supports the thin film transistor 100, and may be, for example, a glass plate, a polymer substrate, or a silicon wafer. The polymer substrate may include, for example, polyethylene terephthalate, polyethylene naphthalate, polycarbonate, polyacrylate, poly(methyl methacrylate), polyimide, polyamide, polyamideimide, a copolymer thereof, or a combination thereof, but is not limited thereto.

The gate electrode 110 is electrically connected to a gate line 111 that transmits a gate signal. The gate electrode 110 may be, for example, made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 105 is a silicon wafer, the gate electrode 110 may be a doped region of the silicon wafer. The gate electrode 110 may have one layer or two or more layers.

The gate insulating layer 120 may be disposed on the gate electrode 110 and cover the whole surface of the substrate 105. The gate insulating layer 120 may include an organic material, an inorganic material, and/or an organic-inorganic material, and may include, for example, an oxide, a nitride, and/or an oxynitride, for example, a silicon oxide, a silicon nitride, a silicon oxynitride, an aluminum oxide, or a combination thereof, but is not limited thereto. For example, the gate insulating layer 120 may include aluminum oxide. The gate insulating layer 120 may be one layer or two or more layers.

The source electrode 130 and the drain electrode 140 are disposed on the gate insulating layer 120. The source electrode 130 and the drain electrode 140 face each other in the center of the gate electrode 110 and may be electrically connected to the semiconductor layer 150 to be described later. The source electrode 130 may be electrically connected to a data line (not shown) that transmits a data signal, and the drain electrode 140 may have an island shape. The source electrode 130 and the drain electrode 140 may include, for example, gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

For example, each of the source electrode 130 and the drain electrode 140 may be a bi-layer, the source electrode 130 may include a lower source electrode 130a and an upper source electrode 130b, and the drain electrode 140 may include a lower drain electrode 140a and an upper drain electrode 140b. The lower source electrode 130a and the lower drain electrode 140a may include, for example, an oxide conductor, and the oxide conductor may include, for example, indium tin oxide (ITO), indium zinc oxide (IZO), zinc tin oxide (ZTO), aluminum tin oxide (AITO), aluminum zinc oxide (AZO), or a combination thereof. The upper source electrode 130b and the upper drain electrode 140b may include, for example, gold (Au), copper (Cu), nickel (Ni), aluminum (Al), molybdenum (Mo), chromium (Cr), tantalum (Ta), titanium (Ti), an alloy thereof, or a combination thereof.

The semiconductor layer 150 may be overlapped with the gate electrode 110, and may be electrically connected to the source electrode 130 and the drain electrode 140. The semiconductor layer 150 may include the aforementioned crystalline p-type semiconductor film, and may include the tin-doped copper halide as described above. As described above, the crystalline p-type semiconductor film may be a transparent p-type semiconductor film. Detailed descriptions of the crystalline p-type semiconductor film are the same as described above. The semiconductor layer 150 may include a channel of the thin film transistor 100, and a p-channel in which a main carrier forming the channel is a hole may be formed by including the aforementioned crystalline p-type semiconductor film.

The aforementioned crystalline p-type semiconductor film may be formed through a solution process, for example, a solution process at a relatively low temperature of less than or equal to about 300° C., for example, less than or equal to about 280° C., less than or equal to about 250° C., less than or equal to about 50° C. to about 300° C., about 50° C. to about 280° C., or about 50° C. to about 250° C. For example, the p-type semiconductor film may be formed by coating a tin-doped copper halide precursor solution through the solution process such as spin coating, slit coating, Inkjet coating, spraying, or dipping, and then heat-treating it.

The tin-doped copper halide precursor solution may be obtained by mixing a copper halide and a tin salt in a solvent.

The copper halide may be copper iodide (CuI), copper bromide (CuBr), copper chloride (CuCl) or a combination thereof, and may be for example copper iodide (CuI).

The tin salt may include, for example, tin chloride, tin chloride hydrate, tin bromide, tin iodide, tin fluoride, tin fluoride hydrate, tin acetate, tin acetate dihydrate, tin acetylacetonate hydrate, tin alkoxide, tin nitrate, tin nitride, a hydrate thereof, or a combination thereof, but is not limited thereto.

The solvent is not particularly limited as long as it may dissolve the copper halide and the tin salt, and may be, for example, methanol, ethanol, propanol, isopropanol, 2-methoxyethanol, 2-ethoxyethanol, 2-propoxyethanol 2-butoxyethanol, methylcellosolve, ethylcellosolve, diethylene glycolmethylether, diethylene glycolethylether, dipropylene glycolmethylether, toluene, xylene, hexane, heptane, octane, ethylacetate, butylacetate, diethylene glycoldimethylether, diethylene glycoldimethylethylether, methyl ethoxy propionate, ethyl ethoxy propionate, ethyl lactate, propylene glycolmethyletheracetate, propylene glycolmethylether, propylene glycolpropylether, methylcellosolveacetate, ethylcellosolveacetate, diethylene glycolmethylacetate, diethylene glycolethylacetate, acetone, methylisobutylketone, cyclohexanone, dimethyl formamide (DMF), N,N-dimethyl acetamide (DMAc), N-methyl-2-pyrrolidone, γ-butyrolactone, diethylether, ethylene glycoldimethylether, diglyme, tetrahydrofuran, acetylacetone, acetonitrile, or a combination thereof, but is not limited thereto.

A ratio of the copper halide and the tin salt may be determined in consideration of electrical properties of the crystalline p-type semiconductor film, for example, a ratio of tin in the tin-doped copper halide ([Sn]/([Sn]+[CuI])) may be less than about 50 wt %, and within the range, about 10 wt % to about 50 wt %, about 10 wt % to about 45 wt %, about 10 wt % to about 40 wt %, about 10 wt % to about 35 wt %, about 10 wt % to about 30 wt %, about 20 wt % to about 45 wt %, about 20 wt % to about 40 wt %, about 20 wt % to about 35 wt %, about 20 wt % to about 30 wt %, about 22 wt % to about 28 wt %, or about 25 wt %.

The passivation layer 160 may be disposed on the semiconductor layer 150, the source electrode 130, and the drain electrode 140 and protect and planarize the thin film transistor 100. The passivation layer 160 may include an organic material, an inorganic material, and/or an organic/inorganic material. For example, the passivation layer 160 may include an organic material, for example, poly(methyl methacrylate). The passivation layer 160 may be one layer or two or more layers.

The thin film transistor 100 according to the embodiment includes the aforementioned crystalline p-type semiconductor film and thus may effectively realize a p channel satisfying high hole mobility, high transparency, and processibility at a relatively low temperature.

For example, the aforementioned p-type semiconductor film may be applied as an active layer of a diode.

Figure 3:
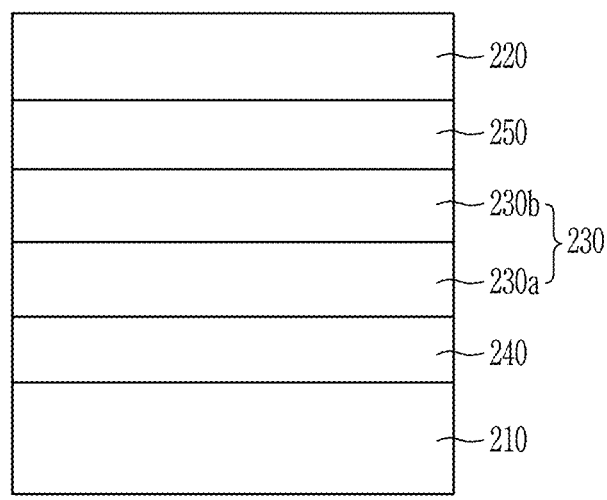
FIG. 3 is a cross-sectional view showing an example of a diode according to an embodiment.

FIG. 3 is a cross-sectional view showing an example of a diode according to an embodiment.

Referring to FIG. 3, a diode 200 according to an exemplary embodiment includes a first electrode 210, a second electrode 220, an active layer 230, a first auxiliary layer 240, and a second auxiliary layer 250.

The first electrode 210 and the second electrode 220 face each other, and one of the first electrode 210 and the second electrode 220 is an anode and the other is a cathode. For example, the first electrode 210 may be an anode and the second electrode 220 may be a cathode.

At least one of the first electrode 210 and the second electrode 220 may be a transparent electrode. The transparent electrode may have a high transmittance of greater than or equal to about 80%, greater than or equal to about 85%, greater than or equal to about 88%, or greater than or equal to about 90% and may include, for example at least one of an oxide conductor, a carbon conductor, and/or a metal thin film. The oxide conductor may be for example one or more selected from indium tin oxide (ITO), indium zinc oxide (IZO), zinc tin oxide (ZTO), aluminum tin oxide (AITO), and aluminum zinc oxide (AZO). The carbon conductor may be one or more selected from graphene and a carbon nanostructure. The metal thin film may be for example formed with a thin thickness of several nanometers to several tens of nanometer or may be a single layer or multiple layers of a metal thin film formed with a thin thickness of several nanometers to tens of nanometer and doped with a metal oxide.

Any one of the first electrode 210 and the second electrode 220 may be a reflective electrode. The reflective electrode may have for example low transmittance of less than about 10% or less than or equal to about 5%. The reflective electrode may include a reflecting conductor such as a metal and may include, for example aluminum (Al), silver (Ag), gold (Au), or an alloy thereof.

The active layer 230 may be disposed between the first electrode 210 and the second electrode 220, and may be a layer in which excitons are generated by combining electrons and holes injected from the first electrode 210 and the second electrode 220, or excitons generated by light absorption, are separated into electrons and holes. For example, the active layer 230 may be a light emitting layer that generates excitons by combining electrons and holes injected from the first electrode 210 and the second electrode 220, or a photoelectric conversion layer (photoelectric layer) that separates excitons generated by light absorption into electrons and holes.

The active layer 230 may include, for example, a p-type semiconductor layer 230a and an n-type semiconductor layer 230b. The p-type semiconductor layer 230a may include a p-type semiconductor and the n-type semiconductor layer 230b may include an n-type semiconductor. The p-type semiconductor included in the p-type semiconductor layer 230a and the n-type semiconductor included in the n-type semiconductor layer 230b may form a pn junction.

The p-type semiconductor layer 230a may include the aforementioned crystalline p-type semiconductor film, and may include a tin-doped copper halide as described above. As described above, the p-type semiconductor film may be a crystalline p-type transparent semiconductor film. Detailed descriptions of the crystalline p-type semiconductor film are the same as described above.

The n-type semiconductor layer 230b may include, for example, an n-type oxide semiconductor, for example, lithium-doped zinc oxide, zinc oxide nanoparticles, or a combination thereof. These n-type oxide semiconductors may have high light transmittance while having high electron mobility.

Here, as an example of the active layer 230, a bi-layer including a p-type semiconductor layer 230a and an n-type semiconductor layer 230b has been exemplified. However, the present disclosure is not limited thereto and the active layer 230 may be a single active layer including a mixture of a p-type semiconductor and an n-type semiconductor. The single active layer may be formed by blending, for example, an n-type semiconductor such as lithium-doped zinc oxide, zinc oxide nanoparticles, or a combination thereof with the aforementioned crystalline p-type semiconductor film.

One of the first auxiliary layer 240 and the second auxiliary layer 250 may be a hole auxiliary layer, and the other may be an electron auxiliary layer. For example, the first auxiliary layer 240 may be a hole auxiliary layer and the second auxiliary layer 250 may be an electron auxiliary layer. The hole auxiliary layer may increase injection and movement of holes and effectively block electrons between the anode that is one of the first electrode 210 and the second electrode 220, and the active layer 230, and the electron auxiliary layer may increase injection and movement of electrons and effectively block holes between the cathode that is the other of the first electrode 210 and the second electrode 220, and the active layer 230. The hole auxiliary layer may include, for example, a hole transporting organic material, a p-type oxide semiconductor, a p-type metal oxide, or a combination thereof, and the electron auxiliary layer may include, for example, an electron-transporting organic material, an n-type oxide semiconductor, an n-type metal oxide, or a combination thereof. At least one of the first auxiliary layer 240 and the second auxiliary layer 250 may be omitted.

The diode 200 according to the present embodiment includes the aforementioned crystalline p-type semiconductor film including the tin-doped copper halide in the active layer 230 (e.g., the p-type semiconductor layer 230a), so that it may exhibit improved rectifying properties compared to the copper halide to provide improved electrical properties.

The aforementioned semiconductor device, the thin film transistor 100, and/or the diode 200 may be included in various electronic devices, for example, a display device or a semiconductor device.

Hereinafter, the embodiments are illustrated in more detail with reference to examples. However, these examples are merely examples, and the present scope is not limited thereto.

PREPARATION EXAMPLES

Preparation Example 1

Copper iodide (CuI, purity 99,999%) and tin chloride ($SnCl_2$, purity 99.99%) are dissolved in acetonitrile to prepare a 0.1 M semiconductor precursor solution. Herein, the tin chloride is supplied to have [Sn]/([Sn]+[CuI]) of 10 wt %.

Preparation Example 2

A semiconductor precursor solution is prepared in the same manner as in Preparation Example 1 except that the tin chloride is supplied to have [Sn]/([Sn]+[CuI]) of 20 wt %.

Preparation Example 3

A semiconductor precursor solution is prepared in the same manner as in Preparation Example 1 except that the tin chloride is supplied to have [Sn]/([Sn]+[CuI]) of 25 wt %.

Preparation Example 4

A semiconductor precursor solution is prepared in the same manner as in Preparation Example 1 except that the tin chloride is supplied to have [Sn]/([Sn]+[CuI]) of 30 wt %.

Preparation Example 5

A semiconductor precursor solution is prepared in the same manner as in Preparation Example 1 except that the tin chloride is supplied to have [Sn]/([Sn]+[CuI]) of 35 wt %.

Comparative Preparation Example 1

A 0.1 M semiconductor precursor solution is prepared by dissolving copper iodide (CuI) in acetonitrile without the tin chloride.

Manufacturing of Thin Film Transistor I

Example 1

A molybdenum layer is formed on a glass substrate through sputtering and then patterned to form a 40 nm-thick gate electrode. On the gate electrode, a 0.2 M aluminum oxide precursor solution (prepared by dissolving aluminum chloride in a mixed solvent of acrylonitrile and ethylene glycol (35:65 v/v)) is spin-coated (2000 rpm, 30 seconds) on a 250° C. hot plate for 5 minutes and heat-treated in a 350° C. furnace for 2 hours to form an 80 nm-thick gate insulating layer. On the gate insulating layer, indium zinc oxide (IZO) and gold (Au) are sequentially sputtered and patterned to form a source electrode and a drain electrode of an IZO/Au bilayer. Subsequently, the semiconductor precursor solution according to Preparation Example 1 is spin-coated on the source electrode and the drain electrode under a nitrogen atmosphere and annealed at 150° C. for 6 hours under vacuum and then patterned to form a p-type semiconductor film. On the p-type semiconductor film, a PMMA solution (solvent: methylethylketone) is spin-coated and cured on a hot plate for 30 minutes to form a passivation layer, and thus manufacturing a thin film transistor.

Example 2

A thin film transistor is manufactured in the same manner as in Example 1 except that the p-type semiconductor film is formed by using the semiconductor precursor solution of Preparation Example 2 instead of the semiconductor precursor solution of Preparation Example 1.

Example 3

A thin film transistor is manufactured in the same manner as in Example 1 except that the p-type semiconductor film is formed by using the semiconductor precursor solution of Preparation Example 3 instead of the semiconductor precursor solution of Preparation Example 1.

Example 4

A thin film transistor is manufactured in the same manner as in Example 1 except that the p-type semiconductor film is formed by using the semiconductor precursor solution of Preparation Example 4 instead of the semiconductor precursor solution of Preparation Example 1.

Example 5

A thin film transistor is manufactured in the same manner as in Example 1 except that the p-type semiconductor film is formed by using the semiconductor precursor solution of Preparation Example 5 instead of the semiconductor precursor solution of Preparation Example 1.

Comparative Example 1

A thin film transistor is manufactured in the same manner as in Example 1 except that the p-type semiconductor film is formed by using the semiconductor precursor solution of Comparative Preparation Example 1 instead of the semiconductor precursor solution of Preparation Example 1.

Evaluation I

The p-type semiconductor films of the thin film transistors according to Examples are evaluated with respect to surface morphology.

The surface morphology is examined with a scanning electron microscope (SEM).

Figure 4:
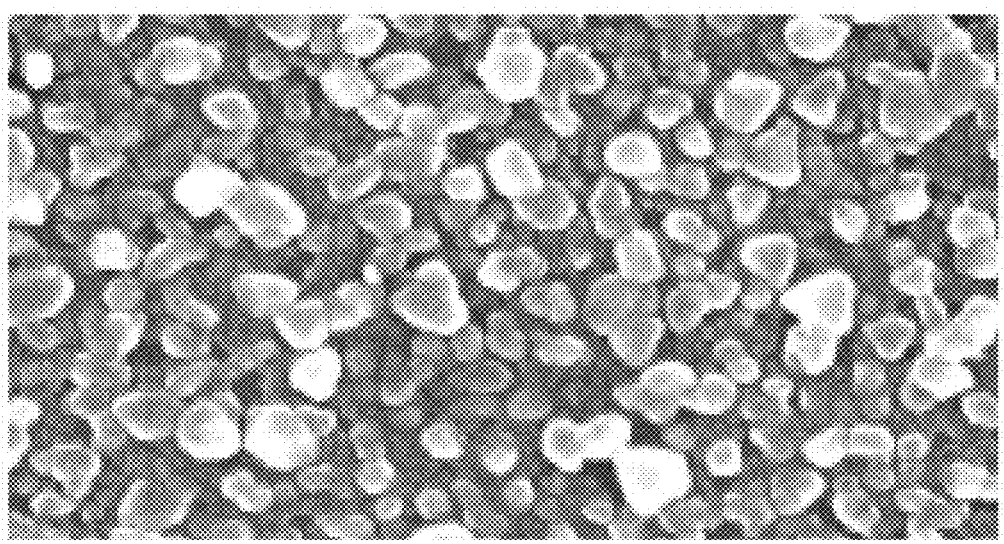
FIG. 4 is an SEM photograph of a p-type semiconductor film of a thin film transistor according to Example 3.
Figure 5:
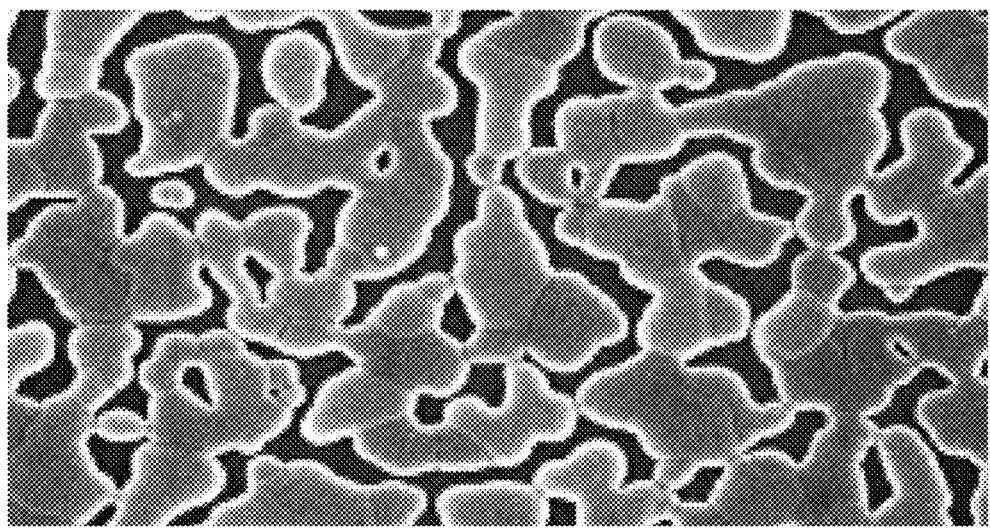
FIG. 5 is an SEM photograph of a p-type semiconductor film of a thin film transistor according to Comparative Example 1.
Figure 6:
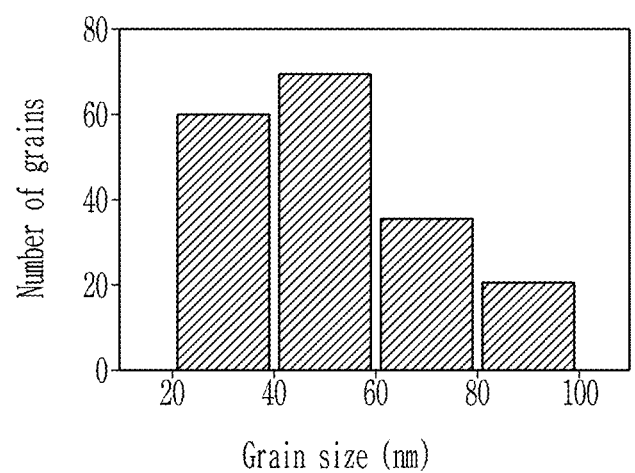
FIG. 6 is a graph showing the grain size distribution of the p-type semiconductor film of the thin film transistor according to Example 3.
Figure 7:
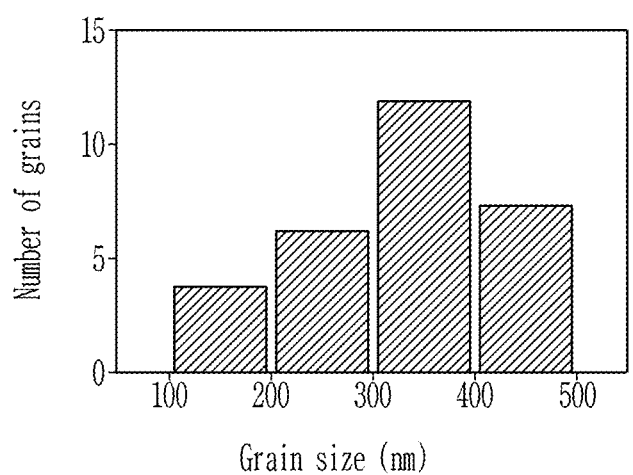
FIG. 7 is a graph showing the grain size distribution of the p-type semiconductor film of the thin film transistor according to Comparative Example

FIG. 4 is an SEM photograph of a p-type semiconductor film of a thin film transistor according to Example 3, FIG. 5 is an SEM photograph of a p-type semiconductor film of a thin film transistor according to Comparative Example 1, FIG. 6 is a graph showing the grain size distribution of the p-type semiconductor film of the thin film transistor according to Example 3, and FIG. 7 is a graph showing the grain size distribution of the p-type semiconductor film of the thin film transistor according to Comparative Example 1.

Referring to FIGS. 4 and 5, the p-type semiconductor film of the thin film transistor according to Example 3 include smaller-sized grains that are closely disposed and thinner grain boundaries, compared with the p-type semiconductor film of the thin film transistor according to Comparative Example 1.

Referring to FIGS. 6 and 7, the p-type semiconductor film of the thin film transistor according to Example 3 has a grain size distribution within a relatively narrow range of about 20 nm to 100 nm, but the p-type semiconductor film of the thin film transistor according to Comparative Example 1 has a grain size distribution within a relatively wide range of about 100 nm to 500 nm.

In summary, the p-type semiconductor film of the thin film transistor according to Example 3 includes small and uniform-sized grains and thin grain boundaries without agglomeration, wherein the grains are closely disposed, compared with that of the thin film transistor according to Comparative Example 1. The thin film transistor according to Example 3 has this surface morphology and thus is expected to have excellent hole mobility.

Evaluation II

The p-type semiconductor films of the thin film transistors according to Examples are evaluated with respect to crystallinity.

The crystallinity is evaluated by using X-ray diffraction (XRD).

Figure 8:
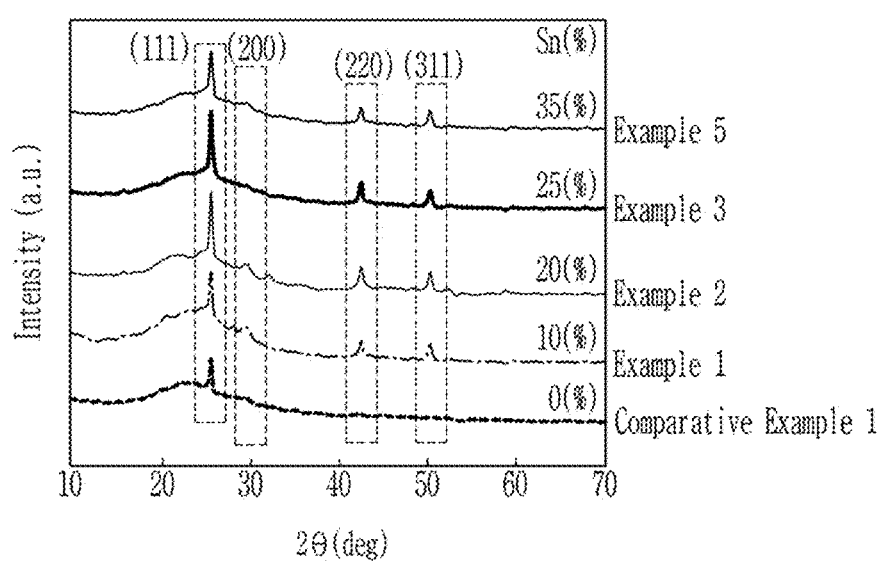
FIG. 8 is an XRD graph of a p-type semiconductor film of a thin film transistor according to examples and comparative examples.

FIG. 8 is an XRD graph of the p-type semiconductor films of the thin film transistors according to Examples and Comparative Examples.

Referring to FIG. 8, XRD spectra of the p-type semiconductor films of the thin film transistors according to Examples and Comparative Example commonly include a diffraction peak ($2\theta$=about 25.61°) corresponding to the (111) plane, but the p-type semiconductor films of the thin film transistors according to Examples, unlike the p-type semiconductor film of the thin film transistor according to Comparative Example, include diffraction peaks ($2\theta$=each about 29.55°, about 42.34°, and about 50.07°) corresponding to the (200), (220), and (311) planes. Accordingly, the p-type semiconductor films including tin-doped copper halide exhibit a characteristic diffraction peak according to the tin doping.

Evaluation III

The p-type semiconductor films of the thin film transistors according to Examples are evaluated with respect to an energy level.

The energy level is measured through ultraviolet photoelectron spectroscopy (UPS) (light source: He1 ray, bias: no, pass energy: 5.0 eV)

Figure 9A:
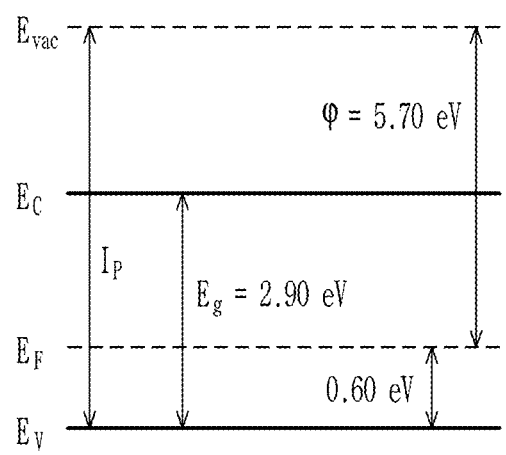
FIG. 9A is an energy diagram of the p-type semiconductor film of the thin film transistor according to Comparative Example 1.
Figure 9B:
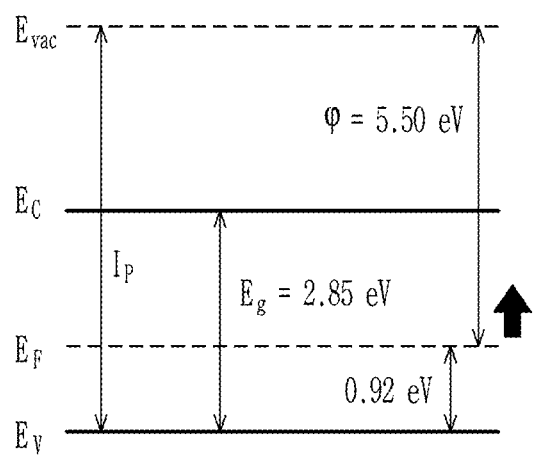
FIG. 9B is an energy diagram of the p-type semiconductor film of the thin film transistor according to Example 3.
Figure 9C:
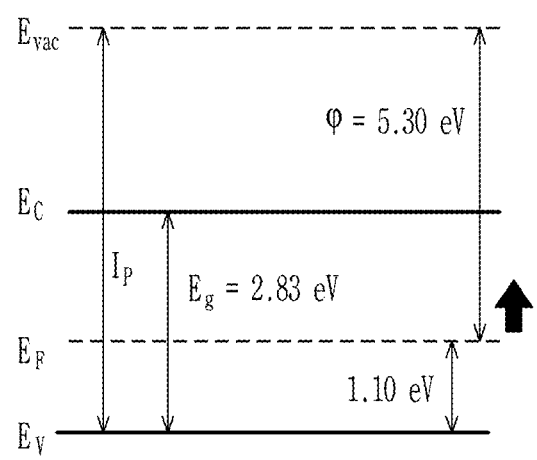
FIG. 9C is an energy diagram of the p-type semiconductor film of the thin film transistor according to Example 5.

The results are shown in FIGS. 9A to 9C and Table 1.

FIG. 9A is an energy diagram of the p-type semiconductor film of the thin film transistor according to Comparative Example 1, FIG. 9B is an energy diagram of the p-type semiconductor film of the thin film transistor according to Example 3, and FIG. 9C is an energy diagram of the p-type semiconductor film of the thin film transistor according to Example 5.

TABLE 1

|  | Fermi level ($E_F$, eV) | Work function ($\varphi$, eV) | Energy bandgap (E.g., eV) |
|---|---|---|---|
| Comparative Example 1 | 0.60 | 5.70 | 2.90 |
| Example 3 | 0.92 | 5.50 | 2.85 |
| Example 5 | 1.10 | 5.30 | 2.83 |

* Fermi level: $|E_V - E_F|$
* Work function: $|E_F - E_0|$
* Energy bandgap: $|E_V - E_C|$ Referring to FIGS. 9A to 9C and Table 1, Fermi levels of the p-type semiconductor films of the thin film transistors according to Examples moves upward (conduction band, Ec) compared with the p-type semiconductor film of the thin film transistor according to Comparative Example, thereby a work function of the p-type semiconductor films of the thin film transistors according to Examples may also be adjustable. Particularly, as the p-type semiconductor films of the thin film transistors according to Examples have a larger tin content, the Fermi level shifts upward to a greater degree, causing a larger change in the work function.

Evaluation IV

The p-type semiconductor films of the thin film transistors according to Examples were evaluated with respect to transparency.

The transparency is measured by using UV-Visible spectrometer (SCINCO S4100 spectrometer).

The results are shown in Table 2.

TABLE 2

|  | Transmittance (@550 nm) (%) |
|---|---|
| Example 1 | 82.94 |
| Example 3 | 80.42 |
| Example 5 | 76.95 |

Referring to Table 2, the p-type semiconductor films of the thin film transistors according to Examples have relatively high transparency of about 75% or more.

Evaluation V

The thin film transistors according to Examples and Comparative Example are evaluated with respect to Hall mobility.

The hall mobility is measured at 300 K by using an Ecopia HMS-3000 Hall Measurement System (Current: 0.1 pA, 1. Delay: 0.1 s, B: 0.55 T, The number of measurements: 1000)

The results are shown in Table 3.

TABLE 3

|  | Hall mobility (cm$^2$ V$^{-1}$s$^{-1}$) |
|---|---|
| Example 1 | 32.79 |
| Example 2 | 37.04 |
| Example 3 | 63.85 |
| Comparative Example 1 | 15.06 |

Referring to Table 3, the thin film transistors according to Examples have high Hall mobility, compared with the thin film transistor according to Comparative Example.

Evaluation VI

The electrical properties of the thin film transistors according to Examples are evaluated.

This evaluation is performed by field effect mobility, current, and subthreshold swing.

The field effect mobility may be obtained by Relation Equation 1.

$$\mu_{FE} = \frac{L g_m}{W C_i V_D} \quad \text{[Relation Equation 1]}$$

In Relation Equation 1, W is a width of the channel, L is a length of the channel, Ci is capacitance per unit area, p FE is field effect mobility, and VD is a drain voltage.

Current characteristics are evaluated by a current flowing at 1 $V_{GS}$–3 V and $V_{DS}$ –6 V.

The subthreshold swing (S.S) is calculated as a gate voltage required for increasing a drain current according to Relation Equation 2 by 10 times.

$$S.S = \frac{\Delta V_G}{\Delta \log(I_D)} \quad \text{[Relationship Equation 2]}$$

The results are shown in Table 4.

TABLE 4

|  | $\mu_{FE}$ (cm$^2$ V$^{-1}$s$^{-1}$) | $I_{DS}$ (µA) (@$V_{GS}$ = –6 V) | SS (mV/decade) |
|---|---|---|---|
| Example 1 | 14.73 | 32.50 | 506 |
| Example 2 | 27.22 | 36.00 | 634 |
| Example 3 | 45.49 | 55.50 | 678 |
| Comparative Example 1 | 4.66 | 6.0 | 989 |

* $\mu_{FE}$: field effect mobility
* $V_{th}$: threshold voltage
* SS: subthreshold swing
* TFT channel width (W)/length (L) = 500 µm/50 µm Referring to Table 4, the thin film transistors according to Examples exhibit improved electrical properties, compared with the thin film transistor according to Comparative Example.

Manufacture of Thin Film Transistors II

Example 6

SiO$_2$ (25 nm)/SiN$_x$ (25 nm)/SiO$_2$ (25 nm)/SiN$_x$ (25 nm)/SiO$_2$ (25 nm) are sequentially deposited on a 10 µm-thick polyimide (PI) substrate to form a barrier layer. On the barrier layer, a molybdenum layer is formed through sputtering and then patterned to form a 40 nm-thick gate electrode. On the gate electrode, a 0.2 M aluminum oxide precursor solution (prepared by dissolving aluminum chloride in a mixed solvent of acrylonitrile and ethylene glycol (35:65 v/v)) is spin-coated (2000 rpm, 30 seconds), cured for 5 minutes on a 250° C. hot plate, and heat-treated in a 350° C. furnace for 2 hours to form an 80 nm-thick gate insulating layer. On the gate insulating layer, indium zinc oxide (IZO) and gold (Au) are sequentially sputtered and patterned to form a source electrode and a drain electrode of an IZO/Au bilayer. On the source electrode and the drain electrode, the semiconductor precursor solution according to Preparation Example 3 is spin-coated under a nitrogen atmosphere at 150° C. for 6 hours under vacuum to form a p-type semiconductor film. On the p-type semiconductor film, a PMMA solution (solvent: methylethylketone) is spin-coated and cured on a hot plate for 30 minutes to form a passivation layer, manufacturing a flexible thin film transistor.

Evaluation VII

The flexible thin film transistor according to Example 6 is bent to have a curvature radius of 5 mm and then evaluated with respect to a change in electrical properties.

Figure 10:
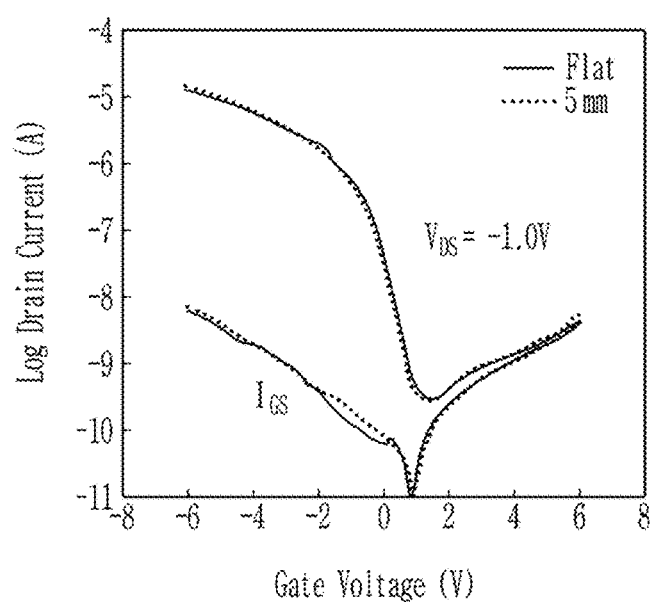
FIG. 10 is a graph showing current characteristics before and after physical deformation of the thin film transistor according to Example 6.

FIG. 10 is a graph showing current characteristics before and after physical deformation of the thin film transistor according to Example 6.

Referring to FIG. 10, the thin film transistor according to Example 6 exhibits substantially the same current characteristics before and after bending to a curvature radius of 5 mm (flat). Accordingly, the thin film transistor according to Example 6 is expected to be effectively applied to a flexible device.

Manufacture of Diode

Example 7

On a glass substrate, ITO (work function: 4.8 eV) is sputtered to form a 200 nm-thick lower electrode. On the lower electrode, a solution for an n-type semiconductor layer, which is prepared by dissolving zinc (Zn) and Li acetate hydrate in 10 ml of isopropylalcohol (IPA) for 6 hours in a water bath (40° C.) and for 2 hours at room temperature, is sprayed and then heat-treated at 350° C. in a spray pyrolysis method to form a 25 nm-thick n-type semiconductor layer. Subsequently, the semiconductor precursor solution according to Preparation Example 3 is spin-coated thereon under a nitrogen atmosphere and then annealed at 150° C. for 6 hours and patterned to form a p-type semiconductor layer. On the p-type semiconductor layer, aluminum is deposited with a shadow mask to form a 100 nm-thick upper electrode, manufacturing a diode.

Comparative Example 2

A diode is manufactured in the same method as in Example 7 except that the semiconductor precursor solution of Comparative Preparation Example 1 instead of the semiconductor precursor solution of Preparation Example 3 is used to form a p-type semiconductor layer.

Evaluation VIII

Electrical properties of the diodes according to Example 7 and Comparative Example 2 are evaluated.

The results are shown in Table 5.

TABLE 5

| | $I_{on}/I_{off}(10^5)$ | Diode Ideality Factor (n) |
|---|---|---|
| Example 7 | 100 | 1.25 |
| Comparative Example 2 | 3 | 1.55 |

* Diod Ideality Factor (n): The closer to n = 1, the more ideal p-n junction diode is exhibited.

Referring to Table 5, the diode according to Example 7 exhibits further idealistic diode characteristics, compared with the diode according to Comparative Example 2 and simultaneously, excellent electrical properties.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A crystalline p-type semiconductor film, the crystalline p-type semiconductor film having a plurality of crystal grains with an average grain size of submicron, wherein the crystalline p-type semiconductor film comprises tin-doped copper(I) iodide, a size of the plurality of crystal grains is distributed within the range of greater than about 0 nm and less than or equal to about 100 nm, and the ratio of tin to the total content of the tin-doped copper(I) iodide is about 22 wt % to about 28 wt %.

2. The crystalline p-type semiconductor film of claim 1, wherein an XRD spectrum of the crystalline p-type semiconductor film has diffraction peaks corresponding to at least one of (200), (220), and (311) planes.

3. The crystalline p-type semiconductor film of claim 1, wherein an energy bandgap of the crystalline p-type semiconductor film is about 2.5 eV to about 3.2 eV.

4. The crystalline p-type semiconductor film of claim 1, wherein a transmittance of the crystalline p-type semiconductor film at a wavelength of 550 nm is about 75% to about 100%.

5. A semiconductor device comprising the crystalline p-type semiconductor film of claim 1.

6. A thin film transistor, comprising
a gate electrode,
a semiconductor layer overlapped with the gate electrode, and
a source electrode and a drain electrode electrically connected to the semiconductor layer,
wherein the semiconductor layer comprises the crystalline p-type semiconductor film of claim 1.

7. The thin film transistor of claim 6, further comprising a passivation layer on the semiconductor layer, wherein the passivation layer comprises poly (methyl methacrylate).

8. A diode comprising
an anode and a cathode, and
an active layer between the anode and the cathode,
wherein the active layer comprises the crystalline p-type semiconductor film of claim 1.

9. The diode of claim 8, wherein
the active layer further comprises an n-type semiconductor, and
the n-type semiconductor comprises an n-type metal oxide semiconductor.

10. The diode of claim 9, wherein the n-type metal oxide semiconductor comprises lithium-doped zinc oxide, zinc oxide nanoparticles, or a combination thereof.

11. The diode of claim 9, wherein the active layer comprises
a p-type semiconductor layer comprising the crystalline p-type semiconductor film, and
an n-type semiconductor layer comprising the n-type semiconductor.

12. An electronic device comprising a semiconductor device, the semiconductor device including a crystalline p-type semiconductor film having a plurality of crystal grains with an average grain size of submicron, wherein the crystalline p-type semiconductor film comprises tin-doped copper(I) iodide, a size of the plurality of crystal grains is distributed within the range of greater than about 0 nm and less than or equal to about 100 nm, and the ratio of tin to the total content of tin-doped copper(I) iodide is about 22 wt % to about 28 wt %.

13. An electronic device comprising a thin film transistor, the thin film transistor including a crystalline p-type semiconductor film having a plurality of crystal grains with an average grain size of submicron, wherein the crystalline p-type semiconductor film comprises tin-doped copper(I) iodide, a size of the plurality of crystal grains is distributed within the range of greater than about 0 nm and less than or equal to about 100 nm, and the ratio of tin to the total content of the tin-doped copper(I) iodide is about 22 wt % to about 28 wt %.

14. An electronic device comprising the diode of claim 8.

* * * * *